United States Patent [19]
Gantioler et al.

[11] Patent Number: 5,446,406
[45] Date of Patent: Aug. 29, 1995

[54] CONTROL CIRCUIT FOR AN MOS SEMICONDUCTOR COMPONENT WITH A SOURCE-SIDE LOAD

[75] Inventors: Josef-Matthias Gantioler; Jenoe Tihanyi, both of Munich, Germany

[73] Assignee: Siemens Aktiengesellschaft, Munich, Germany

[21] Appl. No.: 195,158

[22] Filed: Feb. 10, 1994

[30] Foreign Application Priority Data

Feb. 10, 1993 [DE] Germany .................. 43 03 911.1

[51] Int. Cl.$^6$ ........................................ H03K 17/687
[52] U.S. Cl. ................................. 327/427; 327/432; 327/434
[58] Field of Search ............... 327/427, 432, 433, 434, 327/435, 436, 437, 365, 108, 379

[56] References Cited

U.S. PATENT DOCUMENTS

| | | | |
|---|---|---|---|
| 4,430,586 | 2/1984 | Hebenstreit | 327/432 |
| 4,866,556 | 9/1989 | Hebenstreit | 361/91 |
| 5,006,736 | 4/1991 | Davies | 327/432 |
| 5,160,862 | 11/1992 | Leipold et al. | 327/434 |

FOREIGN PATENT DOCUMENTS 0268930  6/1988  European Pat. Off. .
3018501 11/1981  Germany .
3929026  3/1991  Germany .

*Primary Examiner*—Timothy P. Callahan
*Assistant Examiner*—Toan Tran
*Attorney, Agent, or Firm*—Herbert L. Lerner; Laurence A. Greenberg

[57] ABSTRACT

A control circuit for an MOS semiconductor component having gate and source terminals has a load connected in series with the source terminal. A voltage source at fluctuating potential has first and second terminals. A first controllable semiconductor switch has a control input and is connected between the first terminal of the voltage source and the gate terminal of the MOS semiconductor component. The second terminal of the voltage source is connected to the source terminal of the MOS semiconductor component. A second switch is controllable by an input signal and has first and second load terminals. A line is connected to a fixed potential and to the first load terminal of the second switch. The second load terminal of the second switch is switched from a first to a second potential as a function of the input signal. The first and second potentials are between potentials of the first and second terminals of the voltage source. The first and second potentials are applied to the control input of the first switch for making the first switch conducting whenever an input signal is applied.

6 Claims, 2 Drawing Sheets

CONTROL CIRCUIT FOR AN MOS SEMICONDUCTOR COMPONENT WITH A SOURCE-SIDE LOAD

BACKGROUND OF THE INVENTION

FIELD OF THE INVENTION

The invention relates to a control circuit for an MOS semiconductor component having a source side to which a load is connected in series, and a voltage source at fluctuating potential having a first terminal being connected through a first controllable switch to a gate terminal of the MOS semiconductor component and a second terminal being connected to the source terminal of the MOS semiconductor component.

Such control circuits are known and have been described by way of example in Published European Application No. 0 268 932B2.

Semiconductor components with a source-side load must be conductively controlled with a voltage that is higher than the drain voltage. That can be done with a voltage source connected to fluctuating potential, having potentials which increase as a function of the rise in the source potential in the course of the turn-on process of the MOS semiconductor component. Such voltage sources connected to fluctuating potential may be achieved, for instance, by a transformer coupling, a piezoelectric coupling or an optoelectric coupling. It is also possible to construct the voltage source that is at fluctuating potential by means of a bootstrap capacitor which, with the MOS semiconductor component blocked, is charged through a diode by a voltage source referred to ground. Circuitry problems can arise if that kind of control circuit is meant to be constructed to be compatible with a microcomputer. Those problems arise because the signals for the microcomputer are generally referred to a fixed potential and in particular to ground. The MOS semiconductor component is therefore typically likewise supplied with such a control signal through the transformer, piezoelectric converter or optocoupler.

SUMMARY OF THE INVENTION

It is accordingly an object of the invention to provide a control circuit for an MOS semiconductor component with a source-side load, which overcomes the hereinafore-mentioned disadvantages of the heretofore-known devices of this general type and which does so in such a way that the control can be carried out without major effort or expense by means of a signal referred to a fixed potential.

With the foregoing and other objects in view there is provided, in accordance with the invention, in a control circuit for an MOS semiconductor component having gate and source terminals and a load connected in series with the source terminal, the improvement comprising a voltage source being at fluctuating potential and having first and second terminals, a first controllable semiconductor switch being connected between the first terminal of the voltage source and the gate terminal of the MOS semiconductor component, the first switch having a control input, and the second terminal of the voltage source being connected to the source terminal of the MOS semiconductor component; a second switch being controllable by an input signal and having first and second load terminals, a line being connected to a fixed potential and to the first load terminal of the second switch, the second load terminal of the second switch being switched from a first to a second potential as a function of the input signal; the first and second potentials being between potentials of the first and second terminals of the voltage source; and the first and second potentials being applied to the control input of the first switch for making the first switch conducting whenever an input signal is applied.

In accordance with another feature of the invention, the first controllable semiconductor switch includes a first MOSFET having a gate terminal, a drain terminal connected to the first terminal of the voltage source and a source terminal connected to the gate terminal of the MOS semiconductor component; a series circuit having a current source with terminals, a diode and a node between the current source and the diode, the series circuit being connected between the first terminal and the second terminal of the voltage source; a resistor connected between the gate terminal and the drain terminal of the first MOSFET, the gate terminal of the first MOSFET being connected to one of the terminals of the current source; a second MOSFET having a gate terminal and having a load path connected between the gate terminal of the first MOSFET and the second terminal of the voltage source; and the gate terminal of the second MOSFET being connected to the second load terminal of the second controllable semiconductor switch and to the node.

In accordance with a further feature of the invention, the second controllable semiconductor switch is a MOSFET acting as a current source in a conductive state.

In accordance with an added feature of the invention, there is provided a third MOSFET having a source-to-drain path connected between the gate terminal and the source terminal of the MOS semiconductor component, and having a gate terminal connected to the gate terminal of the second MOSFET.

In accordance with a concomitant feature of the invention, the first controllable semiconductor switch includes a first MOSFET having a gate terminal, a drain terminal connected to the first terminal of the voltage source and a source terminal connected to the gate terminal of the MOS semiconductor component; a second MOSFET having a gate terminal and having a load path connected between the gate terminal of the first MOSFET and the second terminal of the voltage source; a first series circuit having a resistor, a diode and a node between the resistor and the diode, the first series circuit being connected between the first terminal and the second terminal of the voltage source, and the resistor being connected to the first terminal of the voltage source; a second series circuit having a bipolar transistor and a current source, the second series circuit being connected between the first and second terminals of the voltage source, the bipolar transistor having emitter, collector and base terminals, and the emitter terminal of the bipolar transistor being connected to the first terminal of the voltage source; a third series circuit having a current source and a third MOSFET with drain, source and gate terminals, the third series circuit being connected between the first and second terminals of the voltage source, and the source terminal of the third MOSFET being connected to the second terminal of the voltage source; the gate terminal of the second MOSFET being connected to the drain terminal of the third MOSFET, the gate terminal of the third MOSFET being connected to the collector terminal of the bipolar transistor, and the base terminal of the bipolar transistor being connected to the node; and the node being connected through the load path of the second controllable semiconductor switch to the line at fixed potential.

Other features which are considered as characteristic for the invention are set forth in the appended claims.

Although the invention is illustrated and described herein as embodied in a control circuit for an MOS semiconductor component with a source-side load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
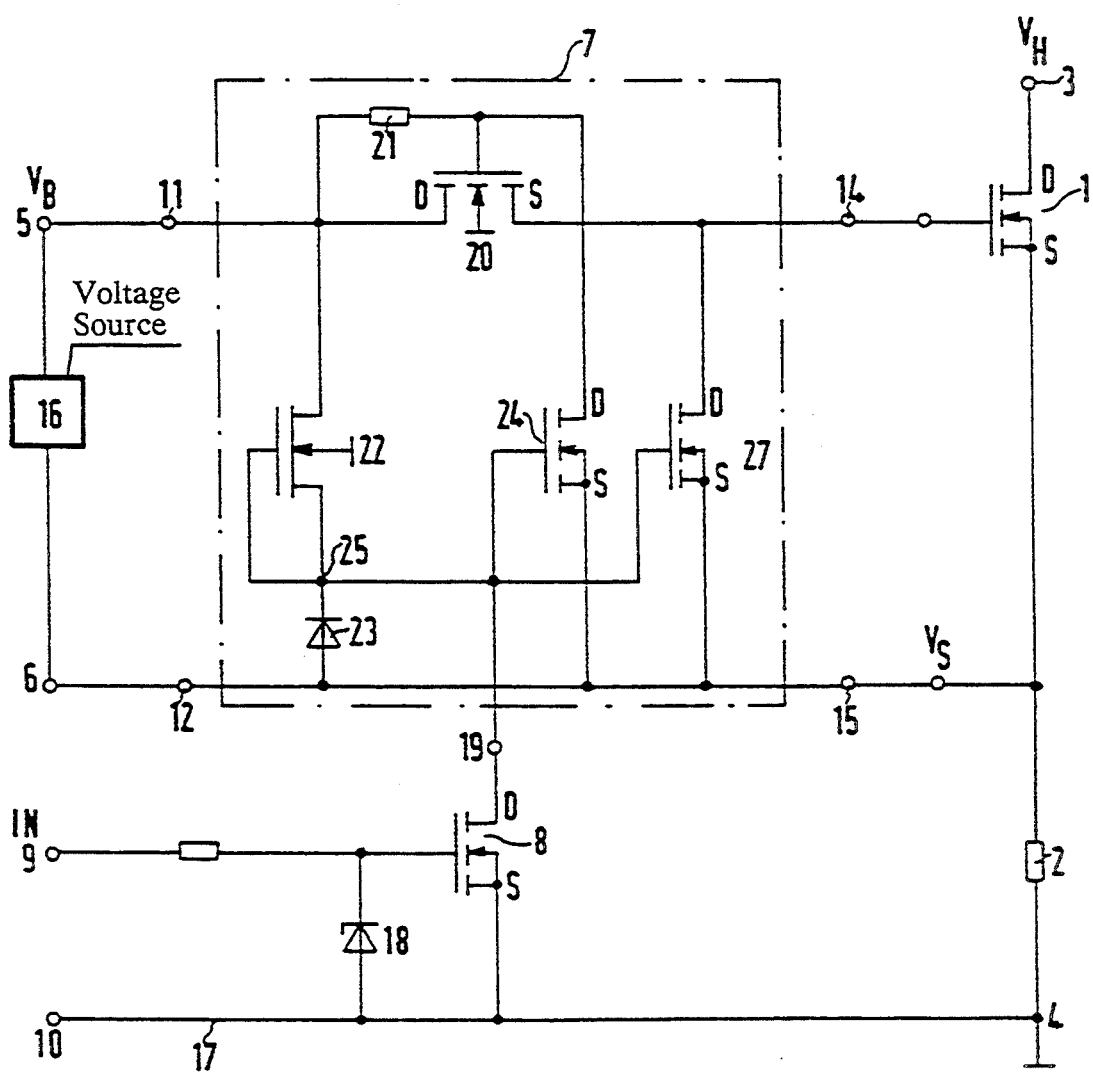
FIGS. 1 and 2 are schematic circuit diagrams of two exemplary embodiments of the invention.

Referring now to the figures of the drawing in detail and first, particularly, to FIG. 1 thereof, there is seen a control circuit which includes an MOS semiconductor component 1 having a source side to which a load 2 is connected in series. The MOS semiconductor component 1 may be a MOSFET or an IGBT. The series circuit is connected through two terminals 3, 4 to a voltage referred to fixed potential, in this case ground. A gate terminal and the source terminal of the component 1 are connected to respective output terminals 14, 15 of a first controllable switch 7. The controllable switch 7 has two input terminals 11, 12, which are connected to first and second terminals 5, 6 of a voltage source 16 that is at fluctuating potential.

The controllable switch 7 has a control input 19, which is triggered through a second controllable switch 8. This controllable switch 8, which in the exemplary embodiment is a MOSFET, in turn is made conducting through an input signal applied to terminals 9, 10. The terminal 10 and therefore a line 17 leading to a source or first load terminal of the MOSFET 8 and to the terminal 4 is at fixed potential, which in the exemplary embodiment is ground. A second load terminal of the MOSFET 8 is connected to the control input 19.

The general mode of operation is such that an input signal referred to ground and applied to the terminals 9, 10 makes the MOSFET 8 conducting, and the current flowing through the MOSFET 8 makes the switch 7 conducting, regardless of its drain potential. The voltage source 16 then charges the gate-to-source capacitor of the MOS semiconductor component 1, so that the latter begins to conduct. The potential at the control input 19 follows a rising source potential $V_S$ of the component 1, so that the switch 7 and therefore the semiconductor component 1 remain conducting, as will be described in detail below.

The first controllable switch 7 includes a first MOSFET 20, having a drain terminal which is connected to the first terminal 5 of the voltage source 16 and having a source terminal which is connected to the gate terminal of the MOS semiconductor component 1. A gate terminal and the drain terminal of the first MOSFET 20 are connected to one another through a resistor 21. A series circuit including a current source 22 and a diode 23 is connected between the terminals 5, 6 on one hand and the terminals 11, 12 on the other hand. An anode terminal of the diode 23 is connected to the second terminal 6. The gate terminal of the MOSFET 20 is also connected to the second terminal 12 through a drain-to-source path of a second MOSFET 24. A gate terminal of the second MOSFET 24 is connected to a node 25 between the current source 22 and the diode 23 and is also connected to the control input 19 of the controllable switch 7. A drain-to-source path of a third MOSFET 27 is connected between the gate terminal and the source terminal of the MOSFET 1, and a gate terminal of the MOSFET 27 is connected to the node 25.

If there is no input signal being fed to the terminals 9, 10, the MOSFET 8 is blocked, and the current source 22, which is constructed as a depletion-type MOSFET, raises the node 25 to a potential that is equal to a potential. $V_B$ at the terminal 5. Since the potential $V_B$ is higher than the source potential $V_S$, the MOSFET 24 is conducting. The potential $V_S$ minus the ON-state voltage of the MOSFET 24 is therefore present at the gate terminal of the MOSFET 20. The potential $V_S$ minus the ON-state voltage of the MOSFET 27, which is made conducting by the potential at the node 25, is present at the source terminal. The MOSFET 20 is therefore blocked. The semiconductor component 1 is likewise blocked, because its gate is connected to the potential $V_S$ through the turned-on MOSFET 27.

If an input signal is applied to the terminals 9, 10, then the MOSFET 8 is made conducting. The MOSFET 8 is dimensioned in such a way that it is driven by the input signal in the horizontal range of its characteristic curves. Accordingly it functions as a current source. If the MOSFET 8 is made conducting, then a current flows from the terminal 5 through the current source 22 and through the MOSFET 8 to ground. The circuit is dimensioned in such a way that in the ON state the MOSFET 8 allows more current to flow than does the current source 22. Therefore the source potential $V_S$ of component 1, minus the ON-state voltage of the diode 23, is accordingly then present at the node 25. This blocks the MOSFET 24, the resistor 21 becomes currentless, and the potential $V_B$ is present at the gate of the MOSFET 20. Since the source potential $V_S$ is still present at the source terminal of the MOSFET 20, the MOSFET 20 is made conducting, and the MOS semiconductor component 1 begins to conduct. Its source potential thus rises. The potential at the node 25 and at the terminal 5 follows the source potential $V_S$, so that the MOSFET 20 remains conducting, and therefore the MOS semiconductor component 1 is controlled to be fully conducting.

The MOSFET 27, in a known manner, serves the purpose of rapid shutoff of the MOSFET 1. If the MOSFET 8 is blocked, it is conducting, and as a result the MOSFET 1 is reliably blocked. If the MOSFET 8 is conducting, the MOSFET 27 is blocked, and the MOS semiconductor component can begin to conduct.

Voltage sources connected to fluctuating potential are known. They may be constructed, for instance, by a bootstrap capacitor, that is connected between the terminals 5 and 6 and is charged through an external voltage source.

As has been explained in conjunction with FIG. 1, the potential at the node 25 ranges between the potential $V_B$ and approximately the potential $V_S$. This major voltage rise can cause undesirable parasitic effects in an integrated circuit. The circuit of FIG. 2 prevents this.

Figure 2:
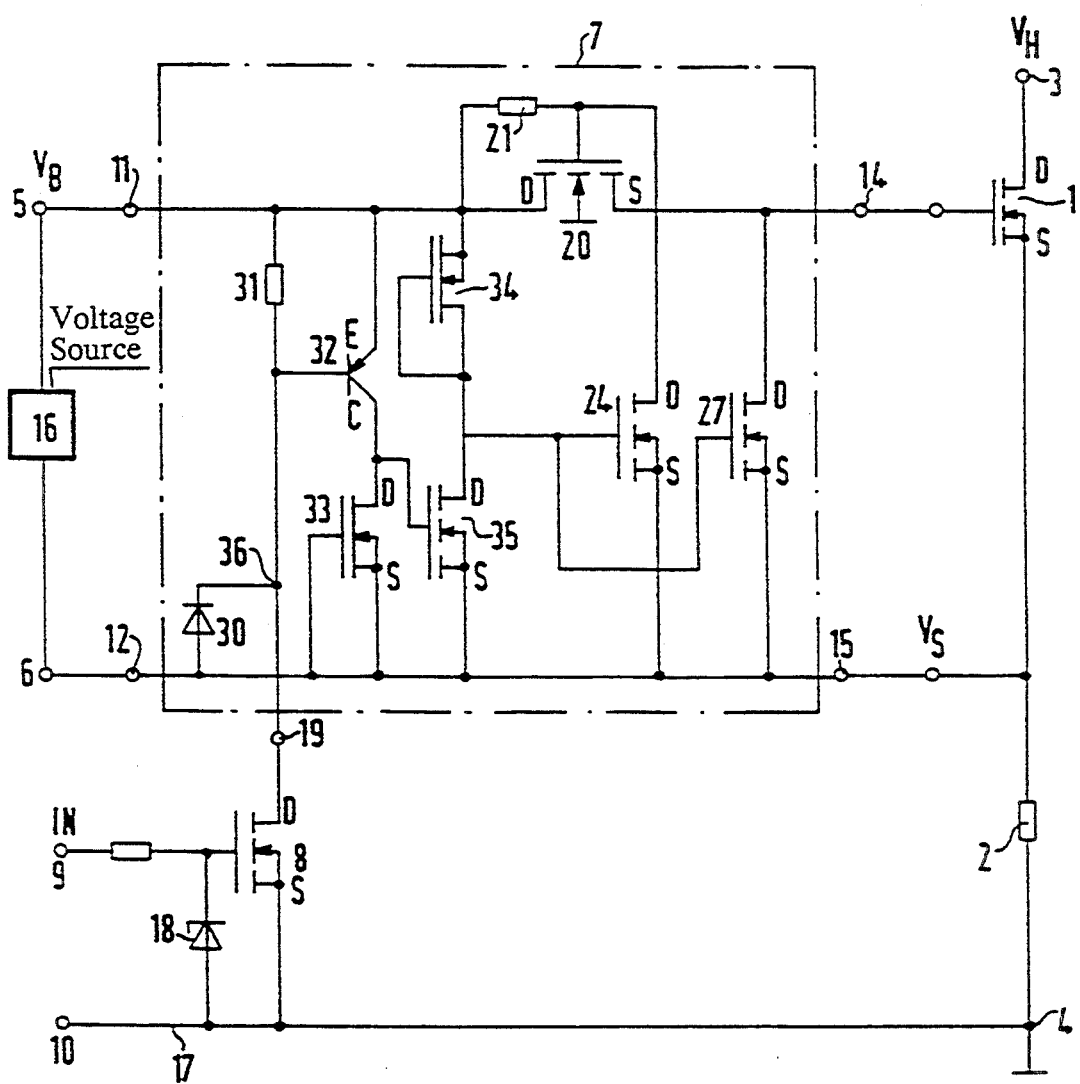

The control circuit of FIG. 2 differs from that of FIG. 1 by having a different embodiment of the first controllable switch 7. Besides the MOSFETs 20 and 24 and the resistor 21, the controllable switch also includes a first series circuit of a resistor 31 and a diode 30. This series circuit is connected between the terminals 5 and 6. A second series circuit of a bipolar transistor 32 and a current source 33 as well as a third series circuit of a current source 34 and a third MOSFET 35, are also located between the terminals 5 and 6. The resistor 31, an emitter terminal of the bipolar transistor 32 and the current source 34 are connected to the terminal 5. A node 36 between the diode 30 and the resistor 31 is connected to a base terminal of the bipolar transistor 32. A collector terminal of the bipolar transistor 32 is connected to a gate terminal of the MOSFET 35. The essential difference in the mode of operation of the circuit of FIG. 2 as compared with that of FIG. 1 is that the potential at the node 36 is connected only between the potential $V_B$ and the potential $V_B$ minus the ON-state voltage of the emitter-to-base path of the bipolar transistor 32. Thus the control circuit can be constructed in integrated form in such a way that a turn-on of parasitic bipolar structures, which are present in any integrated CMOS circuit, is averted.

Once again, as in FIG. 1, the MOSFET 8 is dimensioned as a controllable current source. If there is no input signal at the terminals 9 and 10, the MOSFET 8 is blocked. Thus no current can flow through the resistor 31, and its voltage drop is zero. This results in the bipolar transistor 32 being blocked as well, and no current flows through its collector. The depletion-type MOSFET 33, which is connected as a current source, therefore pulls the potential at the gate of the MOSFET 35 to the potential $V_S$. The MOSFET 35 is therefore blocked, and the current source 34 pulls the potential of the gate of the MOSFET 24 to the potential $V_B$. As a result, the same mode of operation as in the circuit of FIG. 1 ensues: The MOSFET 20 is blocked and the MOSFET 27 becomes conducting. The semiconductor component 1 is thus turned OFF. If an input signal is then present between the terminals 9 and 10, the MOSFET 8 is turned ON, and current flows through the resistor 31. This happens regardless of the magnitude of the potential $V_S$. The voltage drop that occurs in that direction controls the bipolar transistor 32, so that the potential at the gate of the MOSFET 35 is switched to the potential $V_B$. The MOSFET 35 is thus turned ON, and its drain terminal is at the potential $V_S$, minus the ON-state voltage of the MOSFET 35, which must be small. The MOSFETs 24 and 27 are blocked as a result. The MOSFET 20 then becomes conducting, since the resistor 21 is currentless and thus the gate potential of the MOSFET 20 is at the drain potential of the MOSFET 20. As a result, the semiconductor component 1 can be made conducting.

We claim:

1. A control circuit for a MOS semiconductor component having gate and source terminals and a load connected in series with the source terminal, comprising:
   a) a voltage source being at fluctuating potential and having first and second terminals, a first controllable semiconductor switch being connected between the first terminal of said voltage source and the gate terminal of the MOS semiconductor component, said first switch having a control input, and the second terminal of said voltage source being connected to the source terminal of the MOS semiconductor component;
   b) a second controllable semiconductor switch being controllable by an input signal and having first and second load terminals, a line being connected to a fixed potential and to the first load terminal of said second switch, the second load terminal of said second switch being switched from a first to a second potential as a function of the input signal;
   c) the first and second potentials being between potentials of the first and second terminals of said voltage source; and
   d) the first and second potentials being applied to the control input of said first switch for making said first switch conducting whenever an input signal is applied.

2. The control circuit according to claim 1, wherein said first controllable semiconductor switch includes:
   a) a first MOSFET having a gate terminal, a drain terminal connected to the first terminal of said voltage source and a source terminal connected to the gate terminal of the MOS semiconductor component;
   b) a series circuit having a current source with terminals, a diode and a node between said current source and said diode, said series circuit being connected between the first terminal and the second terminal of said voltage source;
   c) a resistor connected between the gate terminal and the drain terminal of said first MOSFET;
   d) a second MOSFET having a gate terminal and having a load path connected between the gate terminal of said first MOSFET and the second terminal of said voltage source; and
   e) the gate terminal of said second MOSFET being connected to the second load terminal of said second controllable semiconductor switch and to the node.

3. The control circuit according to claim 2, wherein said second controllable semiconductor switch is a MOSFET acting as a current source in a conductive state.

4. The control circuit according to claim 2, including a third MOSFET having a source-to-drain path connected between the gate terminal and the source terminal of the MOS semiconductor component, and having a gate terminal connected to the gate terminal of said second MOSFET.

5. The control circuit according to claim 1, wherein said first controllable semiconductor switch includes:
   a) a first MOSFET having a gate terminal, a drain terminal connected to the first terminal of said voltage source and a source terminal connected to the gate terminal of the MOS semiconductor component;
   b) a second MOSFET having a gate terminal and having a load path connected between the gate terminal of said first MOSFET and the second terminal of said voltage source;
   c) a first series circuit having a resistor, a diode and a node between said resistor and said diode, said first series circuit being connected between the first terminal and the second terminal of said voltage source, and said resistor being connected to the first terminal of said voltage source;

d) a second series circuit having a bipolar transistor and a current source, said second series circuit being connected between the first and second terminals of said voltage source, said bipolar transistor having emitter, collector and base terminals, and the emitter terminal of said bipolar transistor being connected to the first terminal of said voltage source;

e) a third series circuit having a current source and a third MOSFET with drain, source and gate terminals, said third series circuit being connected between the first and second terminals of said voltage source, and the source terminal of said third MOSFET being connected to the second terminal of said voltage source;

f) the gate terminal of said second MOSFET being connected to the drain terminal of said third MOSFET, the gate terminal of said third MOSFET being connected to the collector terminal of said bipolar transistor, and the base terminal of said bipolar transistor being connected to the node; and g) the node being connected through the load path of said second controllable semiconductor switch to the line at fixed potential.

6. The control circuit according to claim 5, wherein said second controllable semiconductor switch is a MOSFET acting as a current source in a conductive state.

* * * * *